United States Patent [19]
Ito et al.

[11] Patent Number: 5,220,323
[45] Date of Patent: Jun. 15, 1993

[54] KEYBOARD APPARATUS HAVING GHOST KEY SENSING FUNCTION

[75] Inventors: Sadao Ito; Norio Tsujikawa, both of Tokyo, Japan

[73] Assignee: Oki Electric Industry Co., Ltd., Tokyo, Japan

[21] Appl. No.: 460,665

[22] Filed: Jan. 3, 1990

[30] Foreign Application Priority Data

Jan. 11, 1989 [JP] Japan .................................. 1-2693

[51] Int. Cl.$^5$ ............................................. H03M 11/20
[52] U.S. Cl. .......................................... 341/24; 341/26
[58] Field of Search ................. 341/24, 26; 178/17 C; 307/542.1; 340/825.79; 400/477, 479, 48, 481

[56] References Cited

U.S. PATENT DOCUMENTS

| | | | |
|---|---|---|---|
| 4,106,011 | 8/1978 | Melanson et al. | 341/26 |
| 4,420,744 | 12/1983 | Jesson | 341/25 |
| 4,888,600 | 12/1989 | Anderson et al. | 341/24 |

FOREIGN PATENT DOCUMENTS

62-135919 6/1987 Japan .

Primary Examiner—Donald J. Yusko
Assistant Examiner—Michael Horabik
Attorney, Agent, or Firm—Spencer, Frank & Schneider

[57] ABSTRACT

A keyboard apparatus includes a key matrix having key switches disposed at intersections between rows and columns forming a matrix and a control unit for selecting a row and a column of the key matrix to sense a state of a key switch disposed at an intersection of the selected row and the selected column of the key matrix. The apparatus includes a first confirmation unit for sensing, in a first period of time, a key switch state of the key matrix to confirm whether or not two or more depressed keys exist on a row of the key matrix and a second confirmation unit for sensing again, in a second period of time, a key switch state of the key matrix such that when two or more depressed keys exist on a column of the key matrix, a confirmation is made to determine whether or not two or more depressed keys exist on the row on which the key depression is found in the key matrix. The apparatus temporarily reserves, when the first and second confirmation units confirm that two or more depressed keys exist both of the column and the row of the key matrix, a depression processing of a key switch associated with the depressed keys.

1 Claim, 10 Drawing Sheets

| | PREVIOUS KEY STATE | KEY CHECK | UPDATED PREVIOUS KEY STATE |
|---|---|---|---|
| PRIOR ART |  | POINT a DEPRESSION PROCESSING |  |
| EMBODIMENT |  | POINT b DEPRESSION PROCESSING |  |

⦸ : PROCESSED KEY

③ : KEY REQUIRING DEPRESSION PROCESSING

① : KEY INITIALLY DEPRESSED

Fig. 9

| | PREVIOUS KEY STATE | KEY CHECK | UPDATED PREVIOUS KEY STATE |
|---|---|---|---|
| PRIOR ART |  | UNDER PHANTOM SWITCH CONDITION |  |
| EMBODIMENT |  | RELEASED FROM PHANTOM SWITCH CONDITION |  |

KEYBOARD APPARATUS HAVING GHOST KEY SENSING FUNCTION

BACKGROUND OF THE INVENTION

1. Field of the Invention

The present invention relates to a keyboard apparatus and more specifically to a keyboard apparatus of a scan type in which a plurality of key switches are arranged in the form of a matrix.

2. Description of the Prior Art

In general, in the keyboard apparatuses of that type, various keys are disposed on a keyboard for inputting letters, numeric characters, symbols, etc. The keyboard apparatus includes circuitry to which key switches are interconnected in association with those keys at intersections between scan lines and return lines to form a matrix structure. In general, in the keyboard apparatus, a software system for a microprocessor is employed to achieve a scan control to sense a key operation made by the operator so as to transfer data representative of the operation to a main device or system such as a main processor. In this specification, the words "key depression processing" refer to the circumstances under which the keyboard apparatus transfers to a host processor data representing a depressed key.

In the keyboard apparatus, for example, when three adjacent keys are depressed at the same time, a phantom switch condition occurs. As a result, key switches which are disposed next to these three keys and not actually depressed could be determined as depressed keys in some cases. In order to remove the disadvantage, there has been a conventional technology in which diodes are correspondingly connected to the key switches to prevent a reverse current from flowing in an opposite direction, thereby avoiding the phantom switch condition. However, in accordance with the prior art, since the reverse current preventing diodes are required to be disposed for the respective key switches, the configuration of the keyboard apparatus is further complicated, which in turn increases the size and cost thereof.

In order to remove the disadvantages, for example, the Japanese Patent Laid-Open Publication No. 62-135919/1987 and the U.S. Pat. No. 4,420,744 entitled "Keyboard Crosspoint Encoder Having N-key Rollover" disclose prior art in which without using the reverse current preventing diode, the key depression processing is achieved for keys actually depressed.

For example, in accordance with the prior art disclosed in the Japanese Patent Laid-Open Publication No. 62-135919/1987, when a key switch depression is sensed in a column or row of a key matrix, a confirmation is made to determine whether or not two or more key switches are depressed in the column or row, thereby deciding whether or not the key depression processing is to be executed. Namely, in this conventional technology, when two or more keys are depressed in a column or row, the apparatus determines whether or not there exists two or more depressed keys in the row or column where the depressed keys are found, thereby judging a possibility of the phantom switch condition. If such a possibility is involved, then the key depression processing on the pertinent key is not executed.

More specifically, in a first period of time, when a key state sense scan is performed, a horizontal register is established for indicating whether or not two or more depressed keys are found in a row or column of the key matrix. Furthermore, results from the sensing scan are stored as a present or current key state in the register. In a second period of time, the contents of the horizontal register are ANDed to produce a logical product with the current key state obtained at the same time so as to determine whether or not the phantom switch condition appearing in a case where three or more keys are simultaneously depressed is involved.

However, in accordance with the prior art, since the horizontal register and the present key state obtained at the same time when the horizontal register is produced are ANDed, the present key state is required to be kept stored in the register up to the second period of time. In consequence, there has been a problem that a register of large capacity and a buffer associated therewith are necessary and hence the size and cost of the apparatus are increased. That is, in a keyboard apparatus of this conventional technology, for example, in the case of a key matrix having 8 columns×16 rows=128 key switches, there are required a 16-byte register (one bit for each key) to store the current key state and a 32-byte register (two bits for each key) to store the key state obtained by the previous scan.

In the keyboard apparatus in accordance with the prior art, in association with the register for storing the current key state, there are required a key data transmission buffer (e.g. 16 bytes for 16 keys) and many registers such as a command processing register for processing a command sent from the main system connected to the keyboard apparatus, registers for controlling attributes of key switches specified by the command (e.g. 128 keys×2 bits), a register for storing data supplied by a repeat key, a register for storing a count of the data, and general registers for general-purpose processing. The registers for controlling attributes of a key switch are employed to control data representative of key attributes which are associated with the key switch functions managed by a host system and include (1) an indication of transmitting key data only in response to key depression, (2) an indication of transmitting key data in response to both key depression and key release, (3) an indication of provision or absence of the repeat function, and (4) a void or invalidation key representation.

As described above, a large number of registers are necessary in the keyboard apparatus of the prior art. The keyboard apparatus is primarily controlled, in general, by a control circuit having a microprocessor or the like, which includes storage locations of a random access memory, RAM, are allocated for the registers mentioned above. Consequently, the memory capacity of the internal RAM of the microprocessor becomes insufficient in some cases. To overcome this difficulty, it is necessary to adopt a microprocessor having a large RAM capacity or to dispose an extended or external RAM as a separated unit in addition to the microprocessor. When the external RAM is employed, there are required attached circuits such as an integrated circuit, IC, for controlling a CPU bus in addition to the external RAM. In consequence, these systems cause the cost of the circuit constitution to soar.

Consequently, in order to prevent a ghost key from being sensed due to the phantom switch condition in the conventional keyboard apparatus, an expensive circuit configuration is to be inevitably employed. This resultantly leads to a disadvantage that the constitution is complex and the cost of the apparatus is increased.

SUMMARY OF THE INVENTION

It is therefore an object of the present invention to provide a keyboard apparatus constituted such that the present key state is not stored and the depression processing of a key is not conducted for a ghost key, and that the memory capacity required is decreased with a high operability developed at a low cost, thereby solving the problems noted above.

In accordance with the present invention, there is provided a keyboard apparatus including a key matrix having key switches disposed at intersections between a plurality of rows and columns forming a matrix, and control means for selecting a row and a column of said key matrix to sense a state of a key switch disposed at an intersection of the selected row and the selected column of said key matrix.

The apparatus comprises first confirm means for reading, in a first period of time, a key switch state of said key matrix to confirm whether or not two or more depressed keys exist on a row of said key matrix, and second confirm means for sensing again, in a second period of time, a key switch state of said key matrix such that when two or more depressed keys exist on a column of said key matrix, a confirmation is made to determine whether or not two or more depressed keys exist on the row on which the key depressions in the column is found in said key matrix.

The apparatus temporarily reserves, when said first and second confirm means confirm that two or more depressed keys exist in both a column and a row of said key matrix, a depression processing of a key switch associated with the depressed keys.

In accordance with the present invention, the apparatus comprises first confirm means for sensing, in a first period of time, a key switch state of said key matrix to confirm whether or not two or more depressed keys exist on a column of said key matrix and second confirm means for reading again, in a second period of time, a key switch state of said key matrix such that when two or more depressed keys exist on a row of said key matrix, a confirmation is made to determine whether or not two or more depressed keys exist on the column on which the key depressions were found in said key matrix. The apparatus temporarily reserves, when said first and second confirm means confirm that two or more depressed keys exist in both of the column and the row of said key matrix, a depression processing of a key switch associated with the depressed keys.

In the configuration above, in accordance the present invention, two confirmation means are employed such that the key switch state of a key matrix is sensed in the first period of time, so that if a key switch depression exists in a column or row of the matrix, a confirmation is made to determine whether or not two or more depressed keys are found on the row or column. In the second period of time, the key switch state of the key matrix is again sensed, so that if there exist two or more depressed keys in the column or row, a confirmation is made to determine whether or not two or more depressed keys are found on the row or column where the depressed keys exist.

Specifically, in the first period of time, a key state sensing operation is carried out to produce a horizontal register indicating whether or not two or more depressed keys exist in a row or column of the key matrix. In the second period of time, the key state sensing scan is again performed so as to achieve an AND operation between the obtained current key state and the content of the horizontal register produced in the first period, thereby determining whether or not the phantom switch condition possibly taking place when three or more keys are simultaneously depressed occurs. In a case where two or more depressed keys do not exist in either of a column or a row, namely, where it is confirmed that the phantom switch condition does not take place, the key switch depression processing is achieved; whereas when two or more depressed keys exist in the column and the row, namely, it is confirmed that there exists a possibility of a ghost key due to the phantom switch condition, the key switch depression processing is temporarily reserved to prevent data representative of the ghost key from being inputted.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Referring now to the drawings, a description will be given to an embodiment of the keyboard apparatus in accordance with the present invention.

Figure 1:
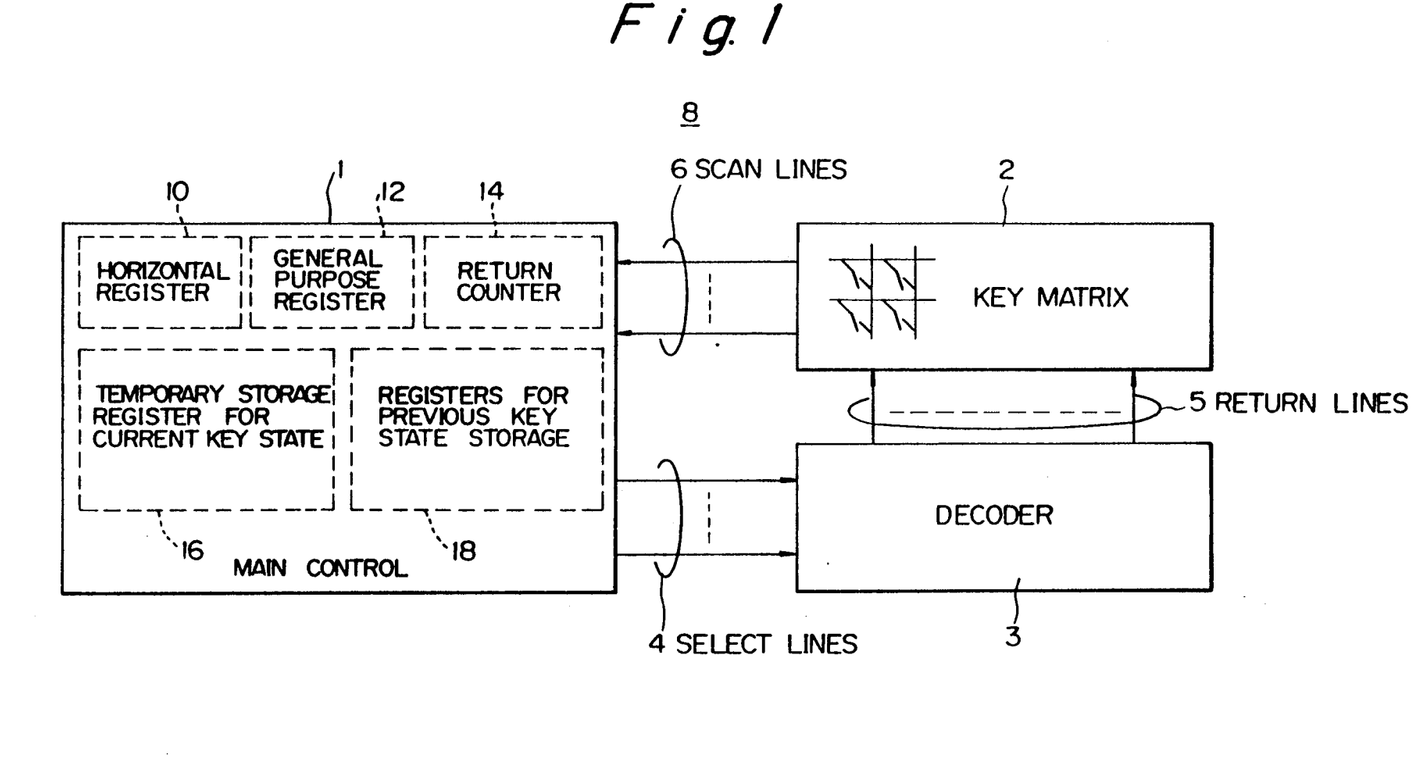
FIG. 1 is a schematic functional block diagram showing an embodiment of the keyboard apparatus in accordance with the present invention.

FIG. 1 is a functional block diagram showing an embodiment of the keyboard apparatus according to the present invention. In this embodiment, a keyboard apparatus 8 is an input device applicable to desk-top and lap-top computers and word processors, for example, and comprises, as shown here, a main control 1, a key matrix 2, and a decoder 3. The main control 1 is connected to the decoder 3 and the key matrix 2 via select lines 4 and scan lines 6, respectively. Moreover, the key matrix 2 is linked via return lines 5 with the decoder 3. Connected to intersections between the return lines 5 and the scan lines 6 are key switches so as to form the key matrix 2. The figure only includes, for easier understanding of the present invention, constituent elements associated with the invention, and not ones which are not directly related thereto, such as an input/output devices interconnected to a main frame or host computer.

The main control 1 is a control circuit which senses a key operation conducted by the operator to notify the condition to the host computer. The main control 1 includes a microprocessor which, for example, comprises a plurality of registers such as a horizontal register 10, a general purpose register 12, a temporary storage register 16 for current key state, and registers 18 for storing previous key states, a return counter 14, etc.

The main control 1 sequentially selects an arbitrary one of return lines 5 by use of the decoder 3. By reading the scan lines 6, the main control 1 senses a state of a key switch associated with the selected return line 5. When all return lines 5 have been selected, the main control 1 recognizes the states of all key switches to execute depression and release processing on the pertinent key switches.

In the description of this embodiment, the term "key depression processing" or "depression processing" means processing in which a signal or data representing an event that a key switch of the key matrix 2 is depressed is delivered from the keyboard apparatus 8 to a computer connected thereto. The term "key release processing" or "release processing" denotes processing in which an event that a key switch of the key matrix 2 is released is notified from the keyboard apparatus 8 to the computer.

The decoder 3 decodes a control output sent from the main control 1 on the return lines 5 to select an instructed one of the return lines 5. Since the embodiment includes 16 return lines, which will be described later, the decoder 3 is controlled by the main control 1 through four select lines 4.

Figure 3:
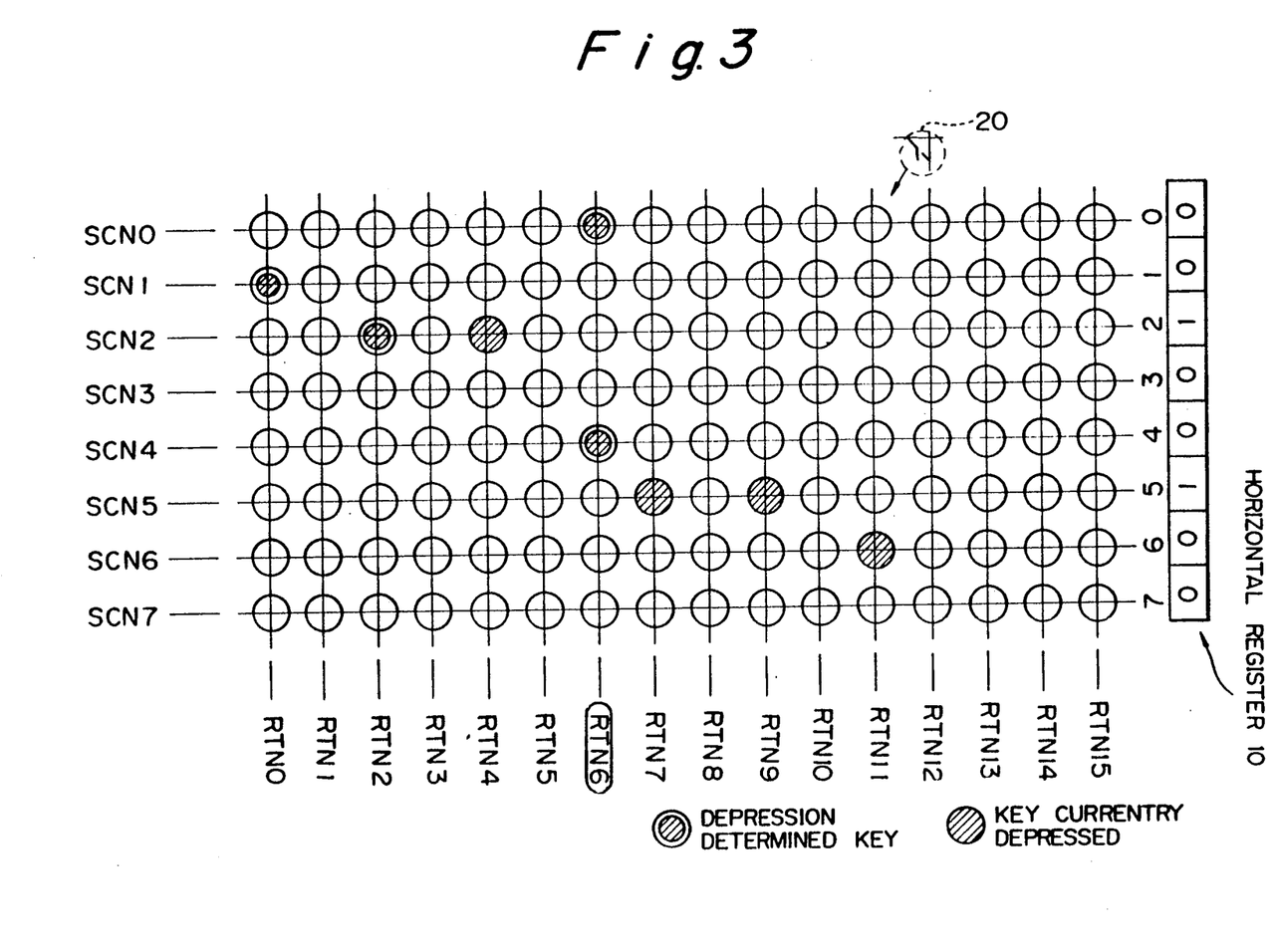
FIGS. 3 and 4 are configuration diagrams schematically showing key matrix constitutions in the embodiment of FIG. 1.
Figure 4:
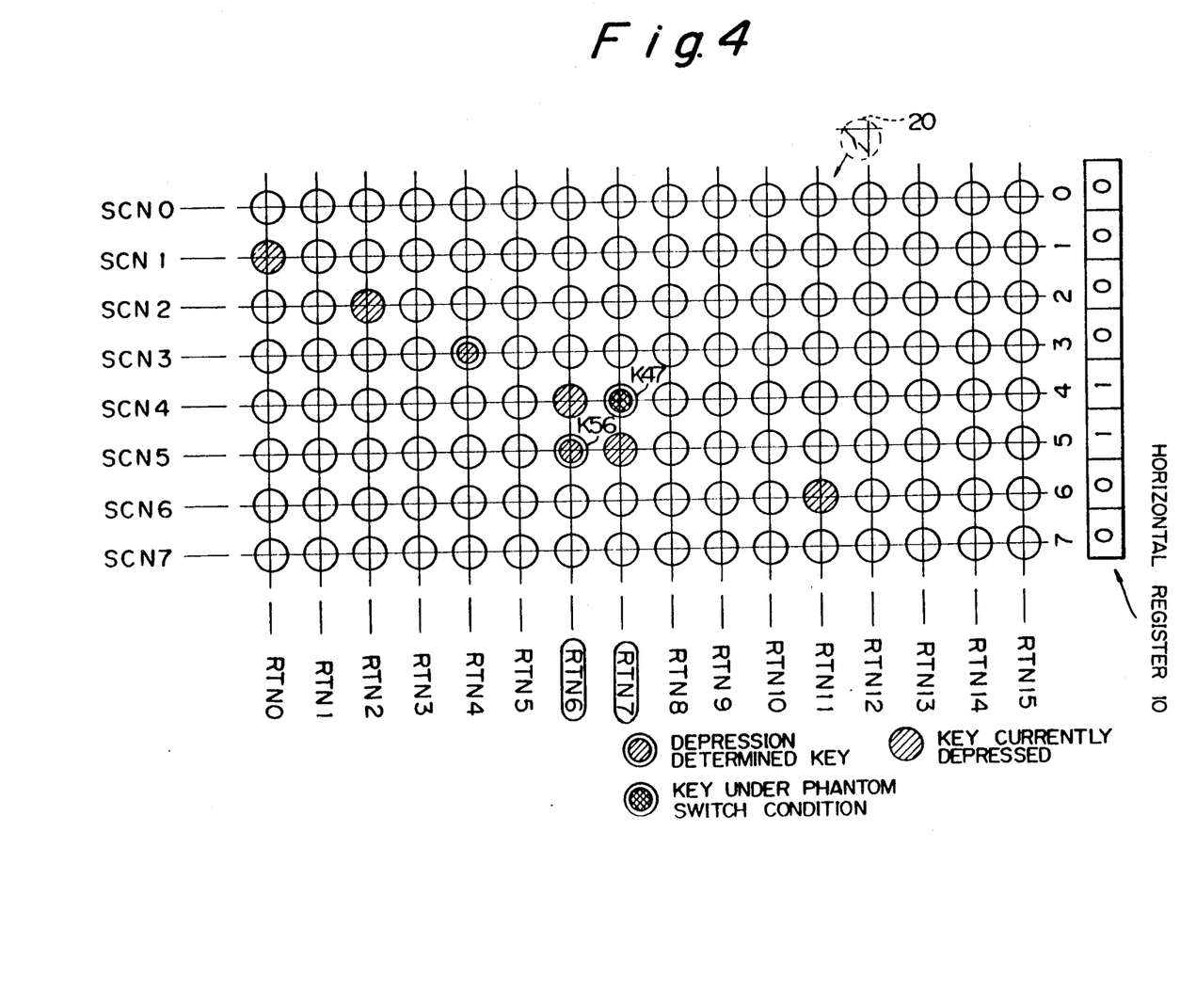

FIGS. 3 and 4 are schematic diagrams showing an example of a configuration of the key matrix 2 and the operation of the horizontal register 10 upon a key switch depression. Scan lines 6 include lines SCN 0 to SCN 7, whereas return lines 5 comprise lines RTN 0 to RTN 15. At the crosspoints of the return lines 5 and the scan lines 6, there are respectively disposed key switches, each of which is structured as indicated in a dotted circle 20.

The horizontal register 10 of the main control 1 includes, for example, eight bits respectively associated with the scan lines 6 (i.e. SCN 0 to SCN 7). Each of the bits stored in the horizontal register 10 indicates whether or not two or more keys are depressed on the associated scan lines 6 of the key matrix 2. More specifically, in FIGS. 3 and 4, the horizontal register 10 having bits #0 to #7, when bit #0 is set to "0", denotes that a sole key is depressed among the key switches connected at the intersections between the scan line SCN 0 and the return lines RTN 0 through RTN 15.

Figure 2A:
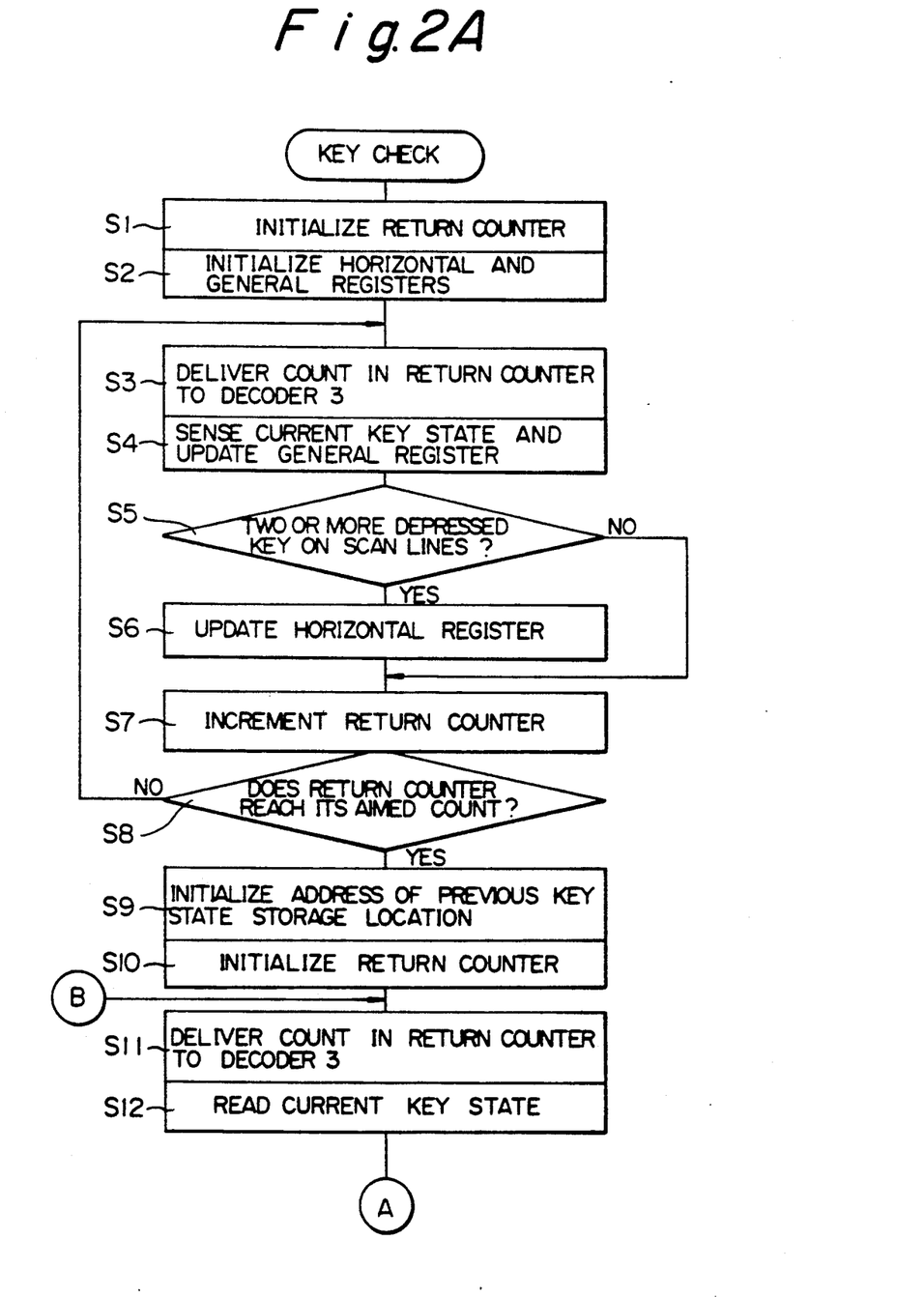
FIGS. 2A and 2B are flowcharts showing operations conducted in the embodiment shown in FIG. 1.
Figure 2B:
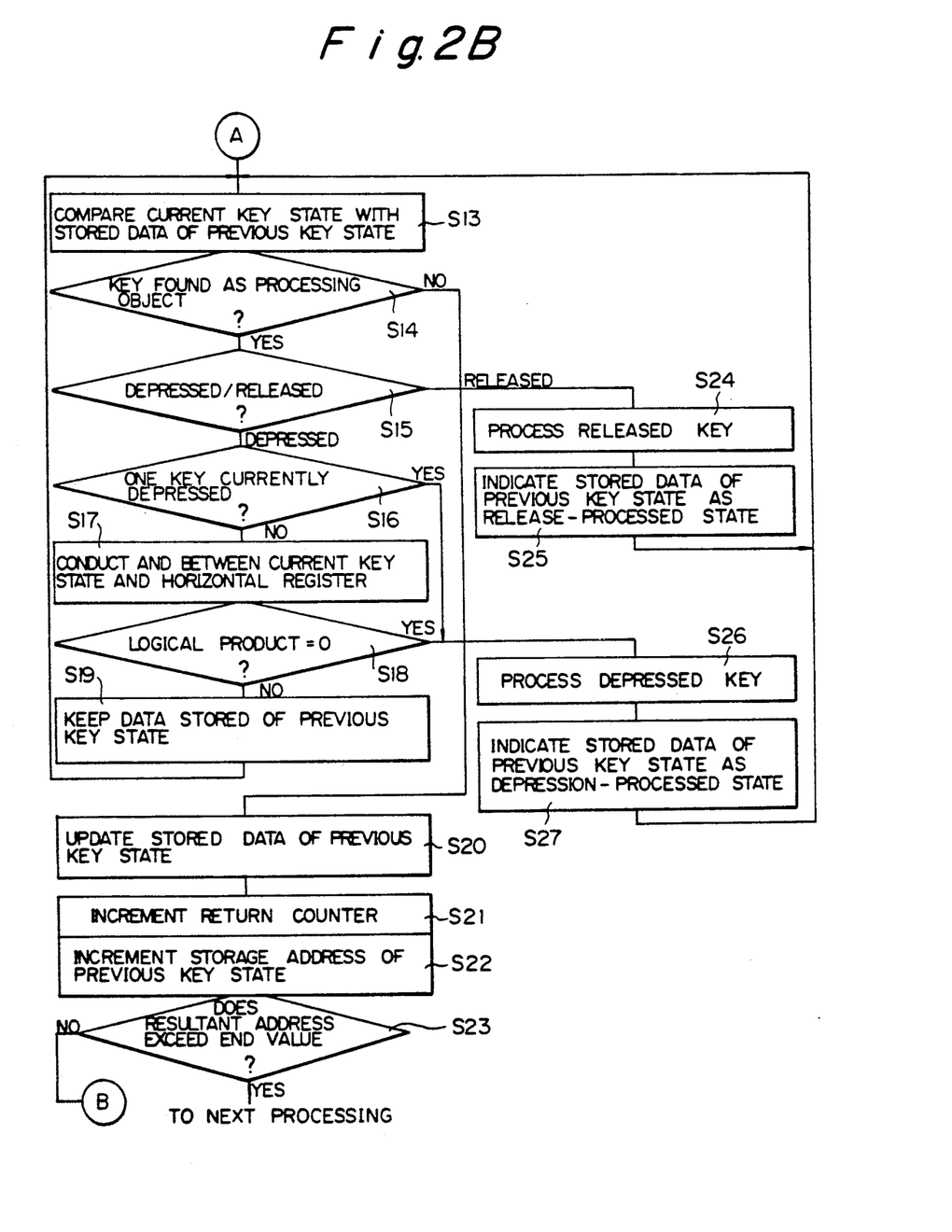

FIGS. 2A and 2B are flowcharts showing operations of the keyboard apparatus 8. Prior to describing the operations of this embodiment, a return counter 14 and various registers appearing in the flowcharts will be described.

The return counter 14 is a counter representing a content of the control output supplied via the select lines 4 of the main control, FIG. 1. In consequence, depending on the content of the return counter 14, one of the return lines 5 including RTN 0 to RTN 15 is selected by the decoder 3. When the return counter 14 is initialized, the content of the counter 14 is reset to a value indicating the return line RTN 0. Upon initialization of the horizontal register 10, the bits #0 to #7 are entirely reset to "0".

The other registers include a general register 12, previous key state storage registers 18 for storing therein the previous key states, and a temporary storage register of the current key state 16 for storing the current key state.

The general register 12 is a register which is used to set "1", in this embodiment for example, to the horizontal register 10. The horizontal register 10 indicates, as described above, whether or not two or more keys are depressed in any one of the scan lines 6. In consequence, the general register 12 includes bits respectively assigned to the scan lines 6. When a key depression takes place, the associated one of the bits is updated to "1". On sensing a key depression, the main control 1 references to the general register 12. If the pertinent bit is "1", the main control 1 sets the associated one of the bits of the horizontal register 10.

Although the general register 12 is adopted primarily for the purpose above, it is also possible to use the register 12 for other purposes. Namely, in this embodiment, for an easier understanding of the present invention, the general register 12 is disposed as a separate unit with respect to the temporary storage register of the current key state 16. However, the general register 12 may function also as the temporary storage register 16. For those applications, it is sufficient for the general register 12 and the temporary storage register 16 to each include eight bits.

The previous key state storage registers 18 are loaded with data representing various state changes of the respective key switches acquired as a result of the scan conducted by the main control 1. More specifically, these registers each are loaded with "00" representing a key release state, "01" indicating an initial depression state, "10" denoting a depression state subsequent to the initial depression (two scans consecutively resultant in the depression state), or "11" designating a key depression processing completed state (three scans successively resultant in the depression state). Since the previous key state data stored is thus represented by a pair of bits for each key, the storage capacity necessary for the previous key state storage registers 18 is 32 bytes which are calculated from 2 bytes ((8 scan lines SCN 0 to SCN 7) ×2 ) multipled by 16 (return lines RTN 0 to RTN 15).

The keyboard apparatus 8 of this embodiment has a scan period, 5 milliseconds, ms, for example. As described above, when the depression state is consecutively found over three scans, the depression processing is achieved, thereby preventing an erroneous sensing of chattering and the like. In FIGS. 3 and 4, depression-determined keys indicated with shaded circles are in a state where the key depression processing has not been conducted yet. Namely, these keys are associated with the content "01" or "10" in the previous key state storage registers 18.

Referring now to FIGS. 2A and 2B, the operation of this embodiment will be described. First, the main control 1 initializes the return counter 14, the horizontal register 10, and the general register 12 (steps S1 and S2). When the initialization is completed, the main control 1 delivers a count held by the return counter 14 on the select lines 4 to the decoder 3 (step S3). This causes the decoder 3 to select one of the return lines 5.

For example, with the initial values, the main control 1 selects the return line RTN 0, FIGS. 3 and 4, so as to scan the key switches connected between the return line RTN 0 and the scan lines SCN 0 to SCN 7 to obtain states of the key switches. Depending on the results of the scan, the general register 12 is updated (step S4). For example, in FIG. 3, a key switch at the intersection between the return line RTN 0 and the scan line SCN 1 is depressed. In consequence, the main control 1 updates the bit associated with the scan line SCN 1 of the general register 12 to "1".

When the scan of the return line RTN 0 is finished, the main control 1 increments the content of the return counter 14 by one (step 7) to scan the key switches connected to the return line RTN 1. Thereafter, in the similar fashion, the key switch scan is continuously achieved up to the final value of the return counter 14, namely, up to the return line RTN 15 (step S8). Moreover, while scanning the depression state of the key matrix 2, the main control 1 updates the horizontal register 10 by use of the general register 12. That is, the main control 1 references to the general register 12 to determine whether or not two or more keys are depressed in respect of any one of the scan lines 6 (step S5). If so, then the main control 1 updates the horizontal register 10 from "0" to "1" (step S6).

For example, in the instance of FIG. 3, two keys are depressed with respect to the scan lines SCN 2 and SCN 5. In consequence, bits 2 and 5 of the horizontal register 10 have been updated from "0" to "1". Similarly, in the example of FIG. 4, bits 4 and 5 have been updated from "0" to "1" in the horizontal register 10.

When all keys have been scanned in the key matrix 2, the main control 1 executes a preprocessing to check the key state. Namely, the main control 1 initializes the addresses of the previous key state storage registers 18 (step S9) and the return counter 14 (step S10). The key check is made through the following procedure. The main control 1 delivers the value indicated by the return counter 14 to the decoder 3 (step S11) and then gets the current key state to store the obtained value in the temporary storage register of the current key state 16 (step S12). Thereafter, the main control 1 compares the current key state with the previous key state (step 13).

Figure 5:
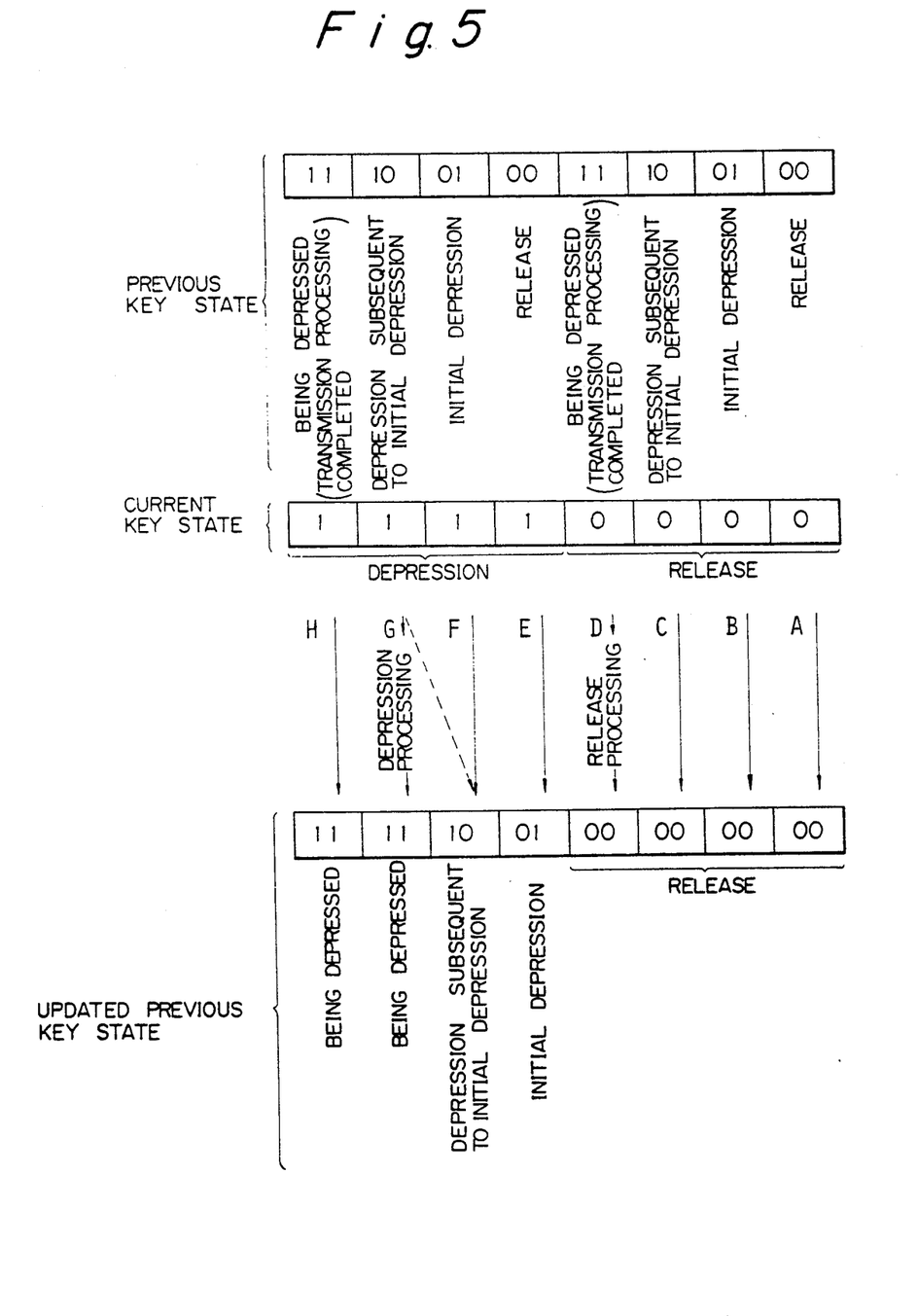
FIG. 5 is a logic diagram useful for understanding operations of the embodiment.

FIG. 5 is an explanatory diagram of the logic for comparing the current key state with the previous key state. This logic will be briefly described with reference to FIG. 5. The previous key state storage registers 18 for storing therein the previous key states are loaded as described above with a value "00", "01", "10", or "11" depending on the associated key states. In the temporary state storage register 16, binary "0" or "1" is stored if the key is in the released or depressed state, respectively. In consequence, as indicated with letters A to H in FIG. 5, eight combinations are possible between the previous and current key states. For example, in a case of the state combination G, the previous key state indicates a depression continuing from the initial depression and the current key state denotes a depression. Consequently, the depression processing is accomplished. In the combination D, for example, since the current key state of a key for which the key depression processing has already been achieved indicates a released state, the release processing is carried out.

Returning to FIG. 2B, the main control 1 compares the current and previous key states as described above to determine whether or not the return line 5 specified by the return line counter includes any key switch to be subjected to the depression or release processing (step S14). If there does not exist such a key switch to be processed (cases A, B, C, E, F, and H, FIG. 5), the register 18 containing the previous key state is updated in accordance with the logic of FIG. 5 (step S20). When the processing is to be accomplished (cases D and G, FIG. 5), the main control 1 determines which one of the depression processing and the release processing is to be achieved (step S15).

If there is found a key for the release processing, the main control 1 executes the release processing to inform the computer of a key release (step S24) so as to then set the data of the previous key state storage register 18 to the release processing completed state (step S25). In the main control 1, the processing returns again to the step S13 to determine whether or not the pertinent return line 5 (the return line RTN 0 when the return counter 14 is in its initialized state) includes another key to be processed.

On the other hand, when the previous key state indicates a key depression subsequent to the initial key depression and the current key state of that key denotes the depressed state, the main control 1 determines whether or not the number of keys depressed on the return line 5 (the return line RTN 0 when the return counter 14 contains the initial value) is one (step S16). If so, then, since the phantom switch condition which could take place when three or more keys are simultaneously depressed does not occur, the main control 1 performs the depression processing to notify the key switch depression to the computer (step S26). The main control 1 then sets the data of the previous key state storage registers 18 to the depression-processed state so as to return, as in the case of the release processing, again to the processing of the step S13.

In the step S16, if there exist a plurality of keys currently being depressed, namely, the current key state data includes a plurality of "1's", the main control 1 conducts an AND operation between the data of the current key state and that of the horizontal register 10. For example, in the return line RTN 6 of FIG. 3 and in the return lines RTN 6 and RTN 7 of FIG. 4, two keys are depressed in the scan lines SCN 0 to SCN 7. Consequently, the system achieves an AND logic between the current key state and the content of the horizontal register 10.

For example, in the case of the return line RTN 6 of FIG. 3, the AND operation results in "0". In this situation, since the ghost switch condition which could take place when three or more keys are simultaneously depressed does not occur, the main control 1 proceeds to the step S26 to achieve the key depression processing (step S18). For example, in the case of the return line RTN 6 or RTN 7 of FIG. 4, the result of the AND operation is "1". Under this condition, there may possibly occur the phantom switch condition which could take place when three or more keys are simultaneously depressed and hence the ghost key which has not actually been depressed may be sensed. In consequence, the main control 1 does not execute the key depression processing for this key with the value of the previous key state storage registers 18 retained (step S19).

FIG. 5 includes a logic marked with an arrow of a broken line to be employed when a ghost key might possibly exist. That is, even when three key depressions are found when the main control 1 scans the key matrix 2 three times (G in FIG. 5), if there exists a possibility of the existence of a ghost key, the depression processing is not executed so as to reserve, as indicated by the arrow of the broken line, the content of the previous key state storage register associated with this key switch. Thereafter, in order to determine whether or not there exists a key to be processed, control returns to the processing of the step S13.

The processing above is repeatedly executed until all keys have been processed for the return line denoted by the return line counter. Thereafter, the register storing the previous key state is updated in conformity with the logic of FIG. 5 (step S20). For the key switch processing of the next return line 5, the main control 1 increments the content of the return counter 14 and the previous key state storage address by one (steps S21 and S22). The main control 1 determines whether or not the resultant storage address is greater than the address end value, namely, whether or not all key switches have already been scanned in the key matrix 2 (step S23). If the address does not reach its end value, control transfers to the processing at the step S11 to repetitively execute the processing above; otherwise, the subsequent processing is conducted.

Referring to FIGS. 3 and 4, a description will be given of a specific example of the operations above. In the cases of the return line RTN 6 of FIG. 3 and the return lines RTN 6 and RTN 7 of FIG. 4, the operational result from the step S17 of FIG. 2 is "0" in the case of FIG. 3 and "1" in both examples of FIG. 4. More specifically, in the example of the return line RTN 6 of FIG. 3, although two keys are depressed on one and the same return line 6, the phantom switch condition does not take place in this situation. Namely, the key depression can be regarded as normal. In consequence, two keys are valid so as to be subjected to the effective depression processing. On the other hand, in the examples of FIG. 4, when a key K56 is depressed, the phantom switch condition might take place and hence a key K47 could be possibly assumed to be depressed. In consequence, it is necessary not to achieve the valid depression processing for the key K47.

The embodiment is featured in that without storing the current key states of all key switches of the key matrix 2 in a memory, an erroneous recognition of depressed keys which might be caused due to an occurrence of the phantom switch condition associated with depressions of plural keys can be prevented. The difference of this embodiment with respect to the prior art storing the current key states in the memory is as follows.

In the conventional technology, a production of a horizontal register and a read-in and storage of the current key state are simultaneously accomplished so as to conduct a key check based on the horizontal register and the current key state obtained at the same time. In contrast thereto, according to the embodiment, the key check is carried out by comparing the horizontal register 10 beforehand created with the current key state just acquired. In the embodiment of the invention, even when the key matrix state when the horizontal register 10 is formed is different from that when the current key state is obtained, the key check can be appropriately accomplished by use of the content of the horizontal register 10 and the current key state.

Figure 6:
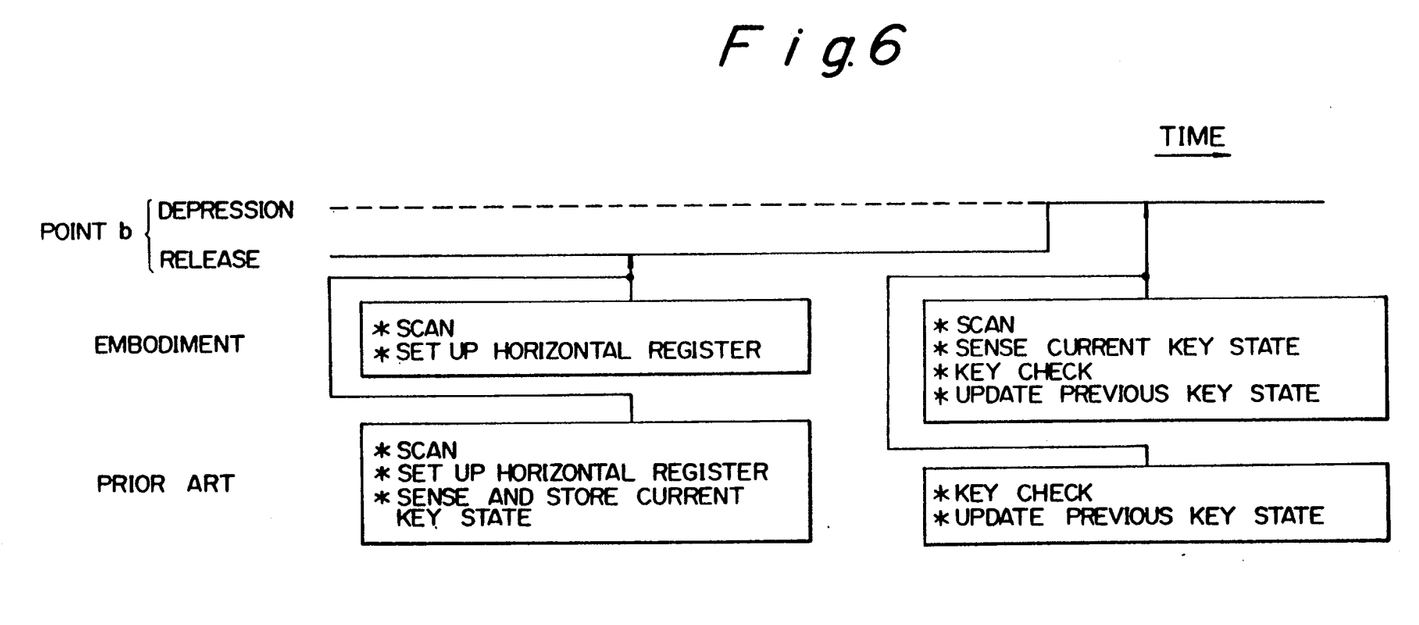
FIG. 6 is a timing chart showing a specific example of differences in operation between the embodiment and the prior art.
Figure 7:
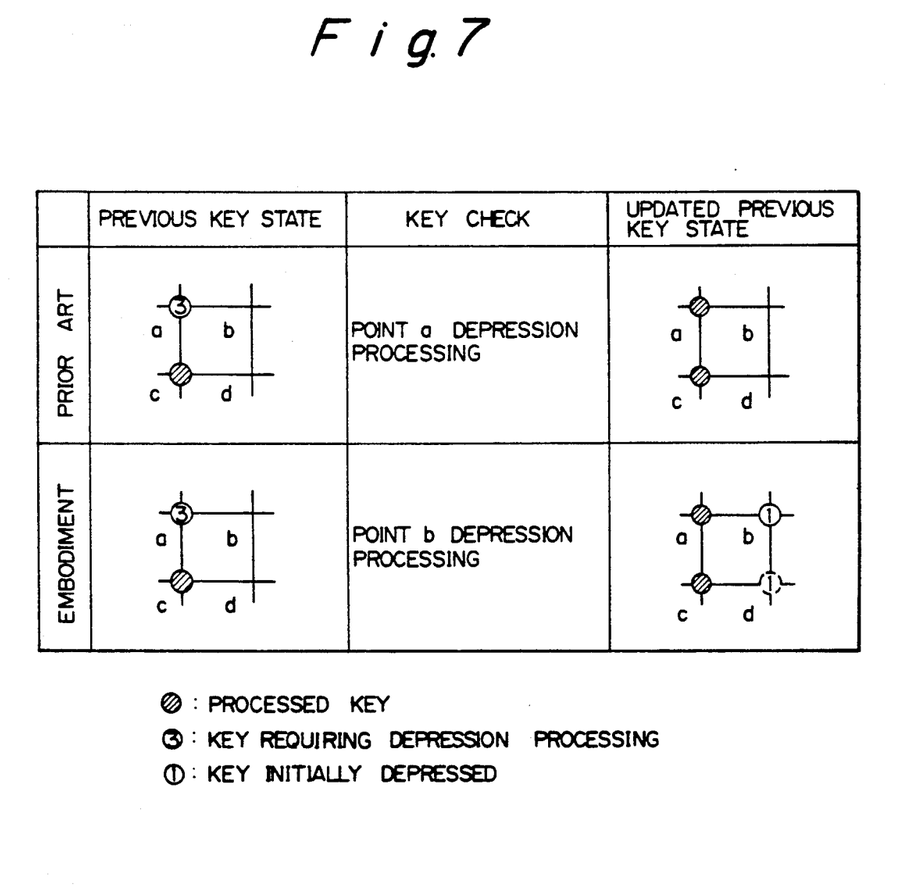
FIG. 7 is an explanatory diagram useful for understanding differences in operation between the embodiment and the prior art in association with the specific example of FIG. 6.
Figure 8:
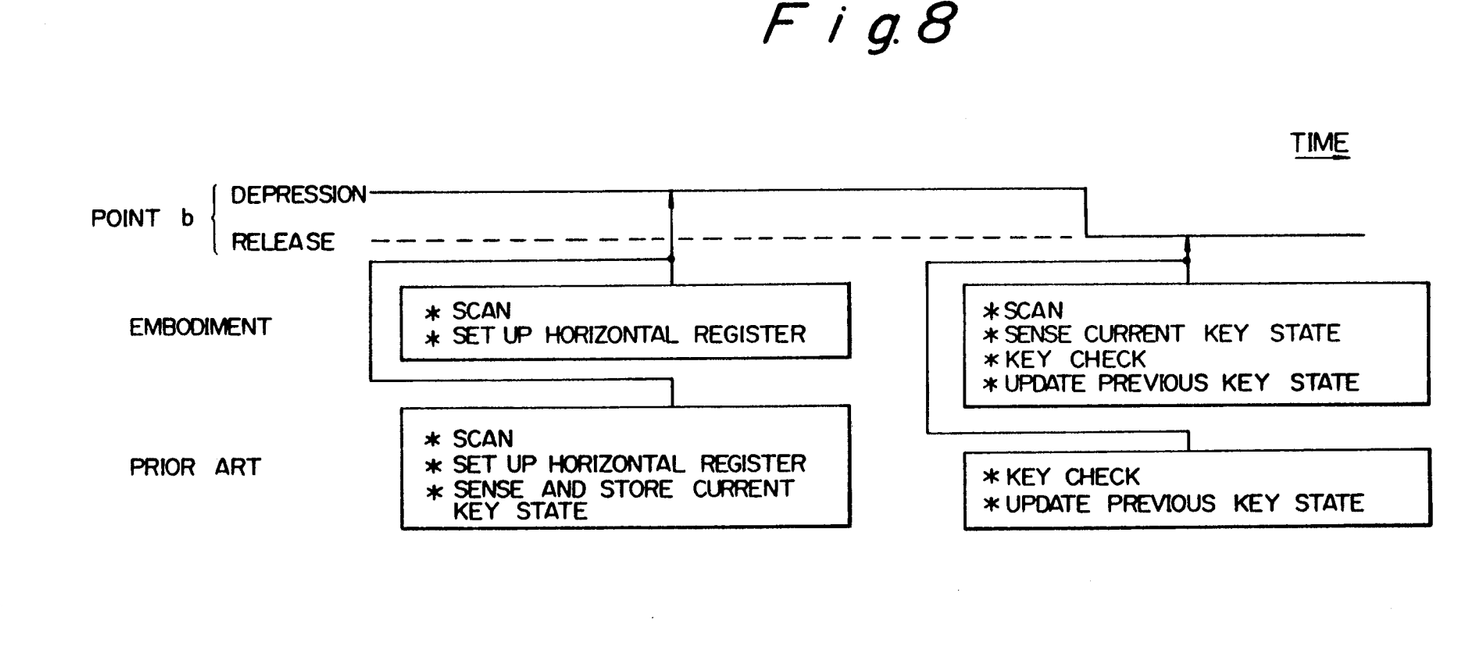
FIG. 8 is a timing chart showing another specific example of differences between the operations of the embodiment and those of the prior art.
Figure 9:
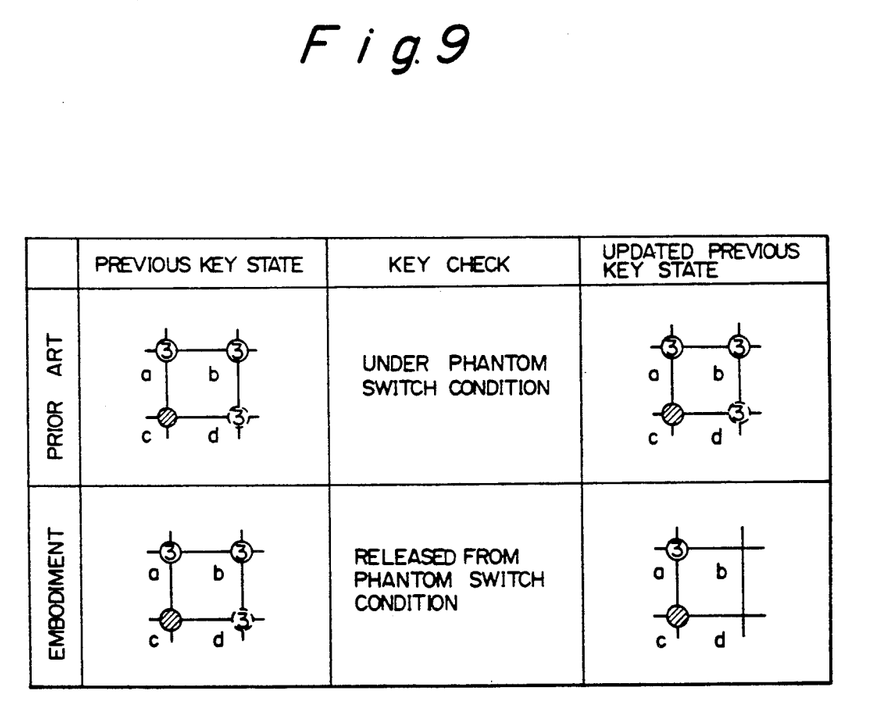
FIG. 9 is an explanatory diagram useful for understanding differences in operation between the embodiment and the prior art in association with the specific example of FIG. 8.

Next, a description will be given of the difference between the embodiment and the prior art described in the Japanese Patent Laid-Open Publication No. 62-135919/1987. FIG. 6 is a timing chart showing the differences between the embodiment and the prior art in a specific example. FIG. 7 is an explanatory diagram for explaining the operational differences between the embodiment and the prior technology in the specific example. FIG. 8 is a timing chart showing the differences between the embodiment and the prior art in another specific example. FIG. 9 is an explanatory diagram for illustrating the operational differences between the embodiment and the prior art in the particular example of FIG. 8.

As shown in FIG. 7 including points a, c, and b and d respectively indicating a depression-confirmed key, a depression-processed key, and released states, let us assume that the key at point b is depressed at a timing shown in FIG. 6. In the prior art, before the key at point b is depressed, a horizontal register is generated so as to achieve a key check based on a current key state stored when the horizontal register is formed. As shown in FIG. 7, the depression processing is conducted for the point a to set the point a as the processed point and hence the previous key state thereof is updated.

On the other hand, according to this embodiment, although the horizontal register 10 is generated before the point b is depressed, since there do not exist two or more depressed keys, the content of the horizontal register 10 is not updated. Subsequently, when the key at point b is depressed, a sensing operation is conducted to acquire the current key state. At the key check point, the point a is a depression-confirmed key, and the point b newly depressed and the point d sensed due to the phantom switch condition are regarded to be in the initial depression state. That is, the judge processing is accomplished through the steps S14 to S17 of FIG. 2B. In the step S18, since the horizontal register 10 has not been updated, control proceeds to the step S26. Like in the case of the conventional technology, the depression processing is achieved for the point a, whereas the initial depression of the point b and d are sensed at a higher speed as compared with the conventional technology so as to update the previous key state.

Next, in a state as shown in FIG. 9 where the points a and b, d, and c respectively indicate depression-confirmed keys, a depression-confirmed key erroneously sensed due to the phantom switch condition, and a depression-processed key, let us assume that the key at point b is released at a timing shown in FIG. 8.

In the prior art, a horizontal register created before the key at point b is released and a current key state obtained at the same time are employed in the key check. Consequently, at a point of time when the key at point b of FIG. 8 is released, the phantom switch condition due to simultaneous depressions of three keys is taking place and hence the previous key is retained. In contrast thereto, according to the embodiment, the horizontal register 10 is formed when the point b is depressed (i.e. under the phantom switch condition), so that when the point b is released, the current key state is acquired to achieve the key check. As a result, at the key check, the point a is judged to be possibly associated with the phantom switch condition based on the ANDed result between the horizontal register 10 and the current key state. In consequence, although previous key state is retained like in the case of the conventional technology, the points b and d can be sensed to be in the released state as compared with the prior art.

As described above, even if the state of the key matrix when the horizontal register 10 is formed is different from the state thereof when the current key state is acquired, the key switches can be appropriately sensed in the similar fashion as for the conventional technology. Moreover, the state change can be sensed at a higher speed as compared with the prior art technology.

Although the horizontal register 10 is arranged for the scan lines 6 in this embodiment, it may naturally be possible to dispose a horizontal register 10 (including 16 bit positions) for the return lines 5. In a case where the horizontal register 10 is arranged in association with the return lines 5, the return counter 14 is altered to be a scan counter. Furthermore, the rows and columns of the embodiment in the description of the operation to sense the key switch depression are to be exchanged with each other.

As described above, in accordance with the present invention, the horizontal register beforehand generated and the current key state just obtained can be used to achieve the key check. In consequence, without storing the current key state data, it is possible to recognize and to ignore the ghost key, thereby providing a keyboard apparatus with a reduced memory capacity, a minimized cost, and a satisfactory operability.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. In a keyboard apparatus having a key matrix, a decoder operatively coupled to the key matrix, and a main control unit, operatively coupled to both the decoder and the key matrix, wherein the main control unit outputs control signals on select lines to the decoder to select one or more columns of the key matrix, reads on scan lines one or more rows of the key matrix, and thereby determines the state of one or more keys in the key matrix, the main control unit comprising horizontal register means having bit positions corresponding in number to rows of said matrix, for storing data indicative of whether or not more than one of the keys in a row are simultaneously depressed, temporary storage means for temporarily storing current key state data, and previous state storage means for storing previous state data of the keys, a method comprising:

performing initialization including setting up the horizontal register-means with initial data for each row indicating whether or not more than one of the keys in a row are simultaneously depressed;

checking for depression of keys in each row of the key matrix sequentially including:

sensing current key state data for keys in a row, temporarily storing the current key state data in the temporary storage means, and comparing the current key state data with the previous key state data stored in the previous state storage means to detect any difference indicating a key has been depressed or released;

upon determining a key in a row has been depressed:

checking the current key state data stored in the temporary storage means to determine whether more than one key in the associated row has been depressed; and if more than one key in the row is determined to be depressed, then:

performing a logical AND between the current key state data and the data in the horizontal register means, and if the result of the AND is logical 0, process depressed key, indicate previous key state data as depression-processed state, and returning to the step of comparing the current key state data with the previous key state data, but if the result of the AND is a logical 1, then keeping data stored of the previous key state, and returning to the step of comparing the current key state data with the previous key state data; but if more than one key in the row is not determined to be depressed, then performing depressed key processing, changing the data in the previous state storage means to indicate a processed state, and returning to the step of checking for depression of keys.

* * * * *